(12) United States Patent
Arakawa et al.

(10) Patent No.: US 7,859,179 B2
(45) Date of Patent: Dec. 28, 2010

(54) ELECTROMAGNETIC WAVE SHIELDING MATERIAL AND DISPLAY USING THE SAME

(75) Inventors: Fumihiro Arakawa, Tokyo-To (JP); Kazuhito Fujii, Tokyo-To (JP); Yukihiro Kyoden, Tokyo-To (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 676 days.

(21) Appl. No.: 11/632,040

(22) PCT Filed: Aug. 29, 2005

(86) PCT No.: PCT/JP2005/015645
§ 371 (c)(1), (2), (4) Date: Jan. 10, 2007

(87) PCT Pub. No.: WO2006/025314
PCT Pub. Date: Mar. 9, 2006

(65) Prior Publication Data
US 2007/0188066 A1    Aug. 16, 2007

(30) Foreign Application Priority Data
Aug. 31, 2004    (JP) .............................. 2004-251217

(51) Int. Cl.
*H01J 17/49* (2006.01)
*H01J 1/52* (2006.01)
*H01J 19/40* (2006.01)

(52) U.S. Cl. ................. 313/238; 313/313; 313/310; 313/582; 313/634; 313/635; 313/110
See application file for complete search history.

(58) Field of Classification Search .................. None

(56) References Cited

U.S. PATENT DOCUMENTS 6,104,530 A  *  8/2000   Okamura et al. ............ 359/359

(Continued)

FOREIGN PATENT DOCUMENTS

JP     A 61-134189     6/1986

(Continued)

*Primary Examiner*—Nimeshkumar D Patel
*Assistant Examiner*—Natalie K Walford
(74) *Attorney, Agent, or Firm*—Oliff & Berridge, PLC

(57) ABSTRACT

An electromagnetic wave shielding material 1 comprises a light-shielding electrical conductor layer 11 having, on its observer-side external surface, a blackening layer 12. The electrical conductor layer 11 comprises a mesh portion 2 that has a large number of openings adjoining one another and faces the center portion 5b of the image-luminescent part 5a of a display device 5, and a frame portion 3 that surrounds the mesh portion 2 and faces the outer edge portion 5c of the image-luminescent part 5a of the display device 5. When trimming the screen of a display D with a black-colored light-shielding layer, since the electromagnetic wave shielding material 1 is used, it is not necessary to perform9 an additional printing step or the like, so that the total number of steps and material cost are not increased. Moreover, such electromagnetic wave shielding material does not cause non-uniformity in light-shielding properties compared with a light-shielding layer formed by printing. The frame portion 3 includes a light-transmitting pattern part 9 having patterned openings 4a.

12 Claims, 6 Drawing Sheets

U.S. PATENT DOCUMENTS 7,119,858 B2 * 10/2006 Kim et al. .................... 349/59
7,371,450 B2 * 5/2008 Arakawa et al. ............ 428/138

FOREIGN PATENT DOCUMENTS

| JP | A 11-233992 | 8/1999 |
| JP | A 2001-343898 | 12/2001 |
| JP | A 2002-009484 | 1/2002 |
| JP | A 2004-241761 | 8/2004 |
| WO | WO 2004/016058 A1 | 2/2004 |

* cited by examiner (A)

(B)

(A)

(B)

ELECTROMAGNETIC WAVE SHIELDING MATERIAL AND DISPLAY USING THE SAME

FIELD OF THE INVENTION

The present invention relates to a display using a display device such as a cathode ray tube or a plasma display panel, and to an electromagnetic wave shielding material to be mounted on the observer-side surface of the display.

BACKGROUND ART

This type of displays using display devices emit, from their screens, not only visible rays that produce images, but also electromagnetic waves in a frequency band of megahertz to gigahertz (electromagnetic waves in this frequency band are hereinafter referred to simply as electromagnetic waves). In order to prevent electromagnetic interference (EMI) on electronic equipment that is caused by these electromagnetic waves, electromagnetic wave shielding materials having the function of bandpass filters, capable of transmitting visible rays but no electromagnetic waves, are mounted on the observer-side surfaces of the displays.

Of these electromagnetic wave shielding materials, a typical one comprises an electrical conductor layer of a metal such as copper or iron and a so-called electrical conductor mesh layer having a large number of visible-light-transmitting openings adjoining one another. In an electromagnetic wave shielding material of this type, a blackening layer, a film of a metallic oxide or the like, is usually formed on the observer-side external surface of the electrical conductor mesh layer, in order to prevent whitening of the displayed image and lowering of contrast that are caused by reflection of extraneous light from the metallic surface (see Patent Document 1).

Further, in order to obtain the electromagnetic wave shielding effect, it is necessary to ground the electromagnetic wave shielding material. For this purpose, a continuous electrical conductor layer having no openings is usually formed, as a frame portion, around the electrical conductor mesh layer (mesh portion) (see Patent Document 2). The frame portion passes no displayed image, so that it has no influence on display performance. To make the area of a screen as large as possible, the frame portion is made outside the screen in such a position that it cannot be seen from the outside when the screen is viewed.

Furthermore, in this type of a display having, on its front surface, an electromagnetic wave shielding material, the screen is trimmed with a black-colored light-shielding layer to make the display more attractive in design. In general, this black-colored light-shielding layer, a trim, is formed, by printing using black ink, on a predetermined outer edge portion of a glass plate to be laminated to and integrated into the electromagnetic wave shielding material (see Patent Document 3).

In addition, in the above displays, to indicate a manufacturer's designation, a product designation, or the like, the desired indication pattern is printed or embossed on a housing or frame by which the screen is surrounded because it is impossible to print or emboss the indication pattern on the screen surface. Further, in order for the indication pattern to glow when the power source is turned on, it is necessary to separately place a light source, such as a miniature electric bulb or an LED, on the rear of the indication pattern.

Patent Document 1: Japanese Laid-Open Patent Publication No. 134189/1986.

Patent Document 2: Japanese Laid-Open Patent Publication No. 233992/1999.

Patent Document 3: Japanese Laid-Open Patent Publication No. 9484/2002.

In the case where a display screen is, as mentioned above, trimmed with a black-colored light-shielding layer, a separate printing step is additionally needed for trimming, which leads to increase in the total number of steps and material cost. Further, to shield light emitted from around the screen, the black-colored light-shielding layer should have good light-shielding properties. In view of this requirement, the formation of the light-shielding layer by printing is disadvantageous because it is not easy to uniformly print the light-shielding layer with a large amount of high-pigment-content ink.

Furthermore, an attempt to indicate a manufacturer's designation, a product designation, or the like on the display inevitably leads to further increase in the total number of steps and material cost. Particularly, in order for the indication pattern to glow when the power source is turned on, an additional step and extra material cost are needed to separately place a light source, and, moreover, the light source consumes extra electric power.

DISCLOSURE OF THE INVENTION

The present invention was accomplished in the light of the above-described problems in the prior art. An object of the present invention is, therefore, to provide an electromagnetic wave shielding material that can make it easy to trim a display screen with a black-colored light-shielding layer and in which the desired pattern for indication can be easily formed, and further to provide a display using the electromagnetic wave shielding material.

The present invention is an electromagnetic wave shielding material incorporated in a display having an image-luminescent part including a center portion and an outer edge portion, the electromagnetic wave shielding material being placed on the observer side of the image-luminescent part, comprising a light-shielding electrical conductor layer having, on its observer-side external surface, a blackening layer, the electrical conductor layer comprising a mesh portion that has a large number of openings and faces the center portion of the image-luminescent part, and a frame portion that surrounds the mesh portion and faces the outer edge portion of the image-luminescent part.

The present invention is the electromagnetic wave shielding material in which the frame portion includes a light-transmitting pattern part having patterned openings.

The present invention is the electromagnetic wave shielding material in which the frame portion covers the outer edge portion of the image-luminescent part and further stretches outward, and the light-transmitting pattern part is made so that it comes on the outer edge portion of the image-luminescent part.

The present invention is the electromagnetic wave shielding material further comprising a transparent substrate for supporting the electrical conductor layer, laminated to the image-luminescent-part-side surface of the electrical conductor layer.

The present invention is the electromagnetic wave shielding material in which the electrical conductor layer is laminated to the transparent substrate with a transparent adhesive layer.

The present invention is the electromagnetic wave shielding material further comprising an anticorrosive layer formed on the blackening layer on the electrical conductor layer.

The present invention is the electromagnetic wave shielding material further comprising a transparentizing resin layer formed to cover the mesh portion of the electrical conductor layer.

The present invention is the electromagnetic wave shielding material in which least one layer selected from a color-tone-controlling layer, a near-infrared-light-shielding layer, an antireflection layer, and an ultraviolet-light-absorbing layer, is formed on the transparentizing resin layer.

The present invention is a display comprising an image-luminescent part including a center portion and an outer edge portion, and an electromagnetic wave shielding material placed on the observer side of the image-luminescent part, the electromagnetic wave shielding material comprising a light-shielding electrical conductor layer having, on its observer-side external surface, a blackening layer, the electrical conductor layer comprising a mesh portion that has a large number of openings and faces the center portion of the image-luminescent part, and a frame portion that surrounds the mesh portion and faces the outer edge portion of the image-luminescent part.

The present invention is the display in which the frame portion includes a light-transmitting pattern part having patterned openings.

The present invention is the display in which the frame portion covers the outer edge portion of the image-luminescent part and further stretches outward, and the light-transmitting pattern part is made so that it comes on the outer edge portion of the image-luminescent part.

The present invention is the display further comprising a transparent substrate for supporting the electrical conductor layer, laminated to the image-luminescent-part-side surface of the electrical conductor layer.

The present invention is the display in which the electrical conductor layer is laminated to the transparent substrate with a transparent adhesive layer.

The present invention is the display further comprising an anticorrosive layer formed on the blackening layer on the electrical conductor layer.

The present invention is the display in which a transparentizing resin layer formed to cover the mesh portion of the electrical conductor layer.

The present invention is the display in which at least one layer selected from a color-tone-controlling layer, a near-infrared-light-shielding layer, an antireflection layer, and an ultraviolet-light-absorbing layer, is formed on the transparentizing resin layer.

The electromagnetic wave shielding material of the present invention has the following advantages: When trimming a display screen with a black-colored light-shielding layer by using the electromagnetic wave shielding material, it is not necessary to perform an additional step of printing or the like, so that the total number of steps and material cost are not increased. Moreover, such electromagnetic wave shielding material does not cause non-uniformity in light-shielding properties, compared with a light-shielding layer formed by printing.

Further, when forming the desired indication patterns, such as a manufacturer's designation and a product designation, on a display by using the electromagnetic wave shielding material of the invention does, it is not necessary to perform printing the indication patterns on the body or frame of the display. Moreover, since the electromagnetic wave shielding material can make the indication patterns glow without a separate light source, an additional step and extra material cost for placing a separate light source are not needed, and extra electric power is not consumed.

BEST MODE FOR CARRYING OUT THE INVENTION

Embodiments of the present invention will be hereinafter described in detail with reference to the accompanying drawings.

Figure 1:
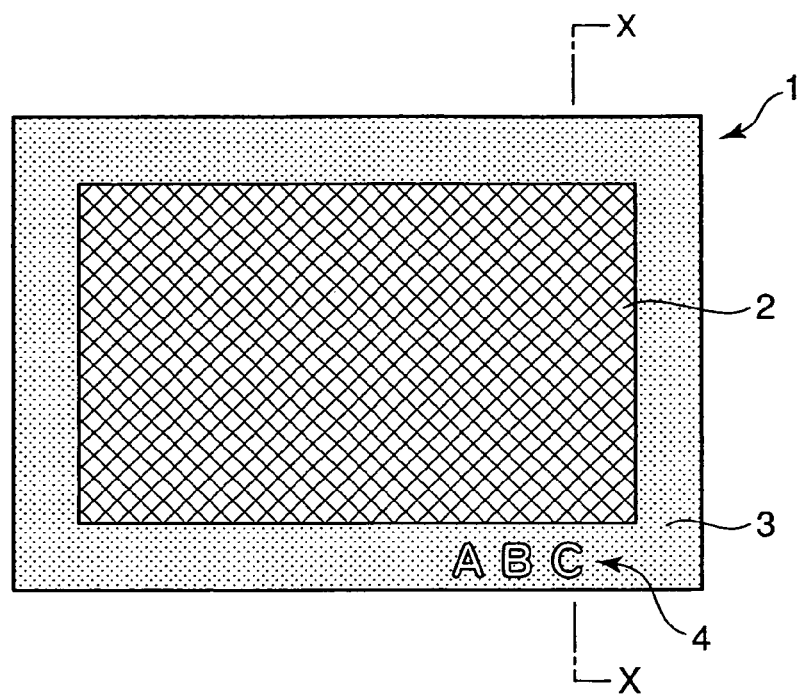
FIG. 1 is a plane view showing an electromagnetic wave shielding material according to the present invention.
Figure 2:
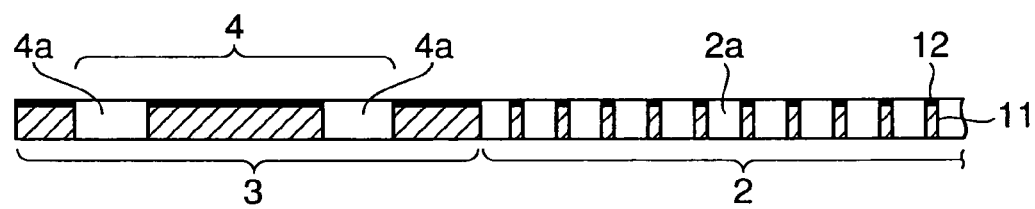
FIG. 2 is a sectional view showing an example of section X-X in FIG. 1.
Figure 3:
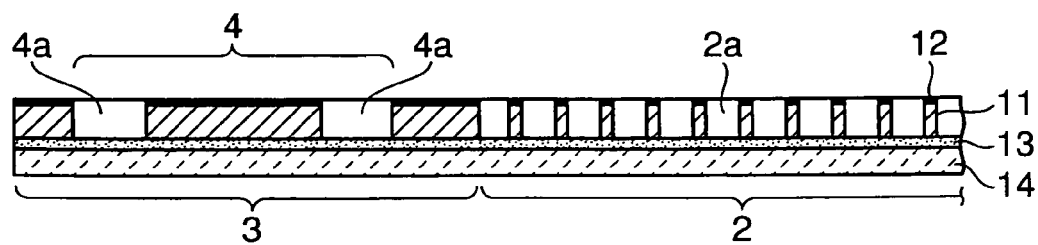
FIG. 3 is a sectional view showing another example of section X-X in FIG. 1.
Figure 4:
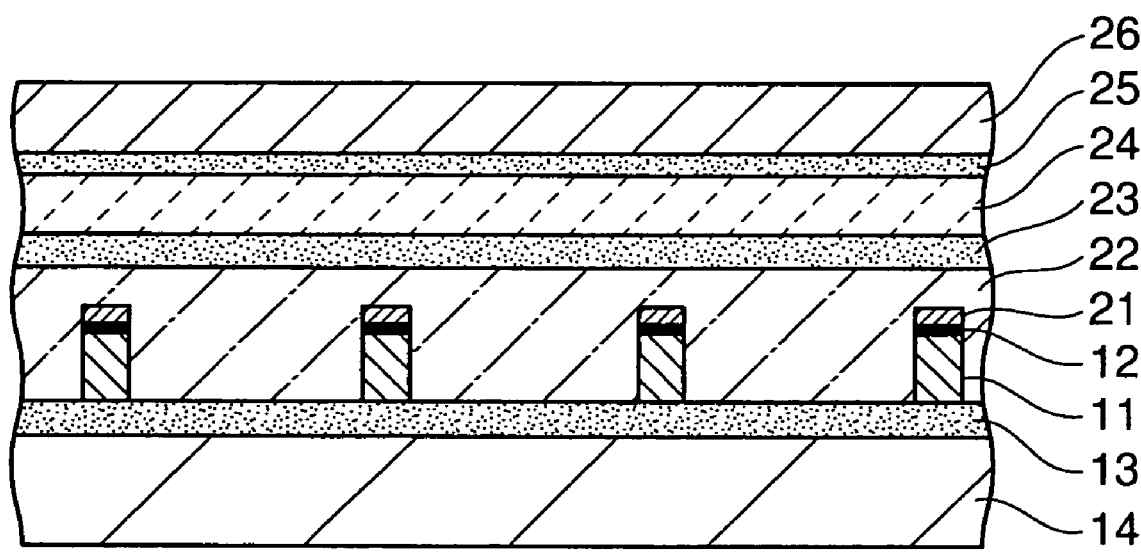
FIG. 4 is a sectional view showing another embodiment of the sectional structure shown in FIG. 3.
Figure 5:
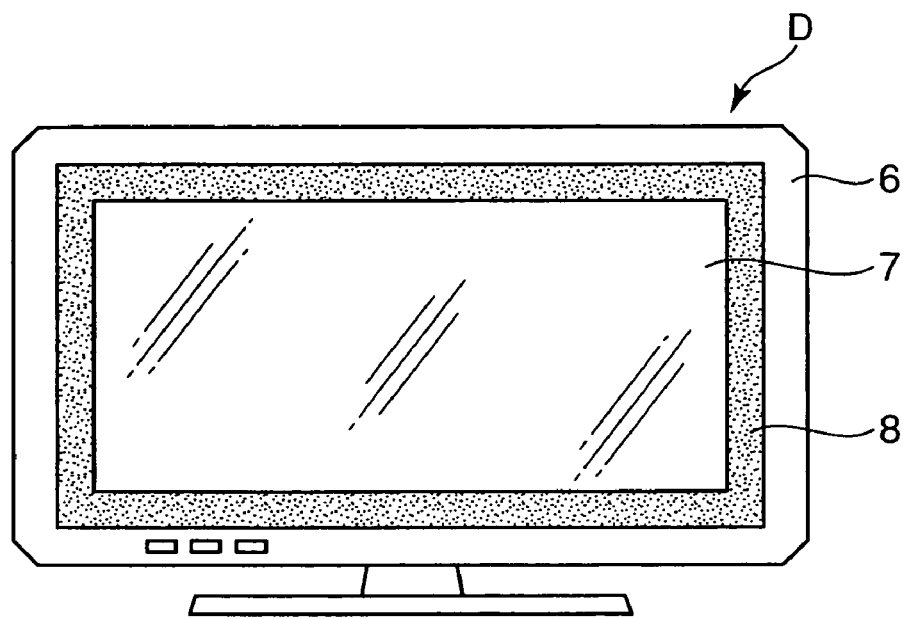
FIGS. 5(A) and 5(B) are front views showing a display according to the present invention that is off and on, respectively.
Figure 5:
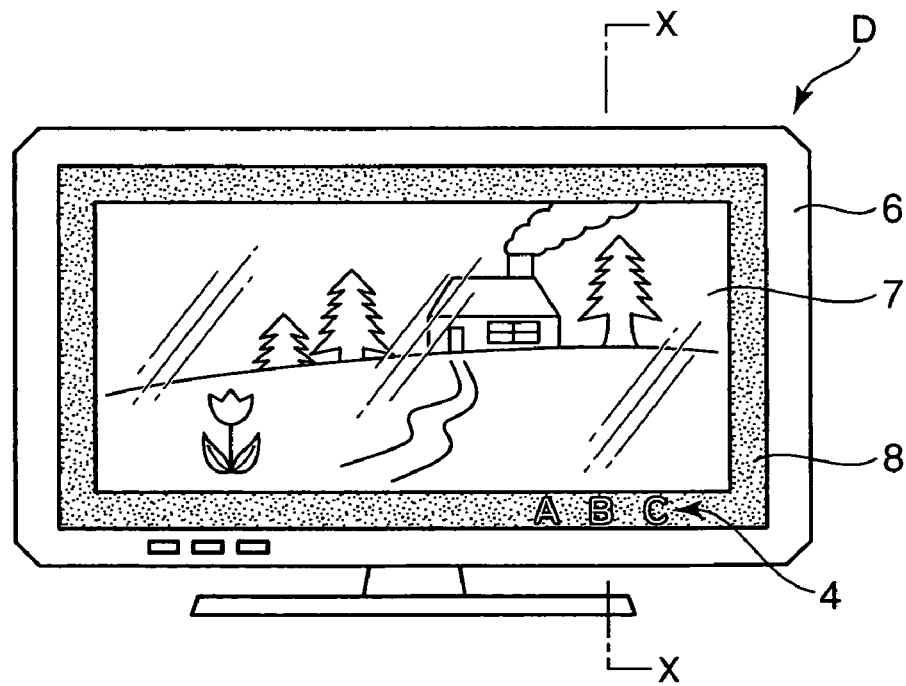
Figure 6:
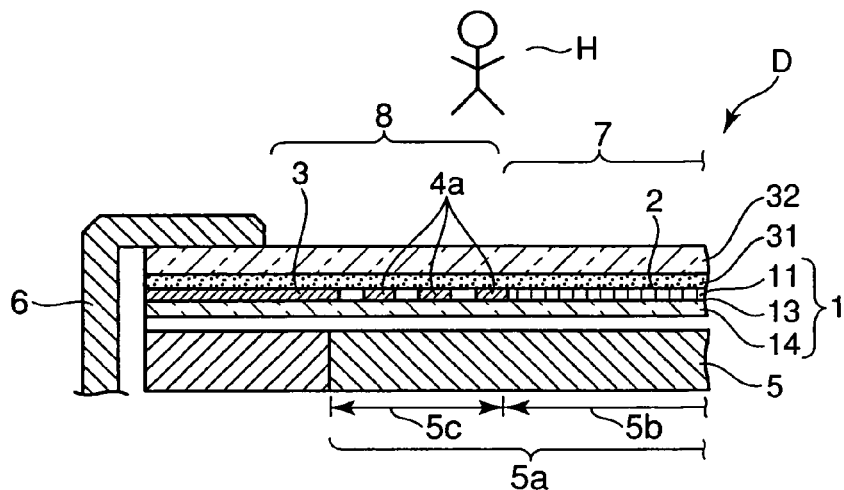
FIG. 6 is a sectional view showing an example of section X-X in FIG. 5(B).
Figure 7:
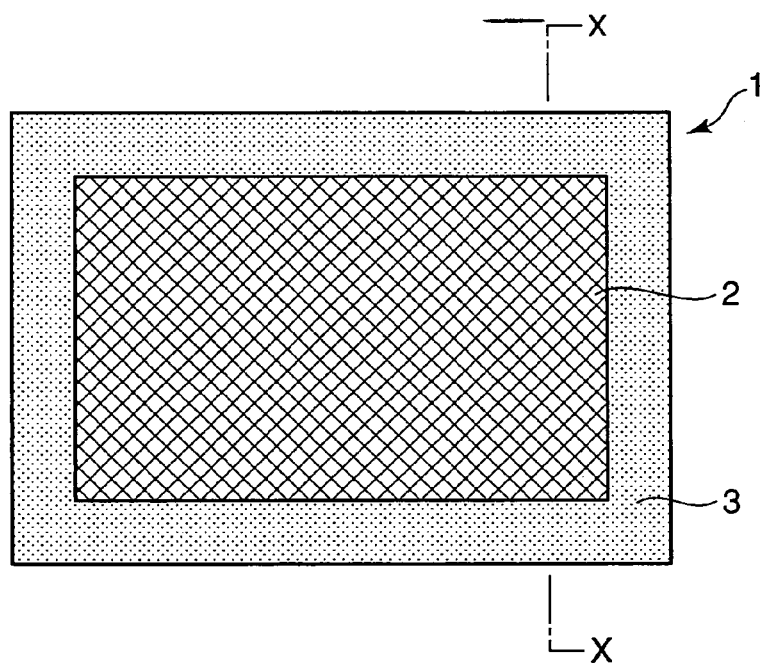
FIG. 7 is a plane view showing a conventional electromagnetic wave shielding material.
Figure 8:
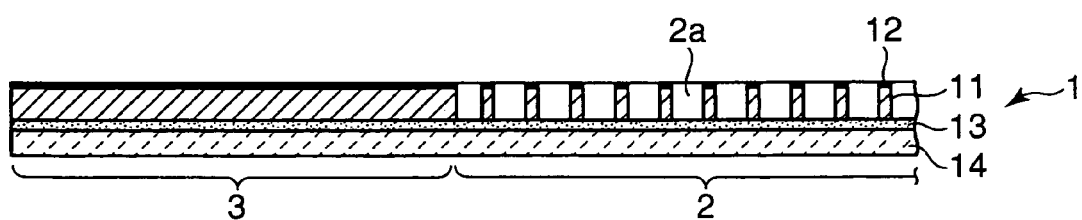
FIG. 8 is a sectional view showing section X-X in FIG. 7.
Figure 9:
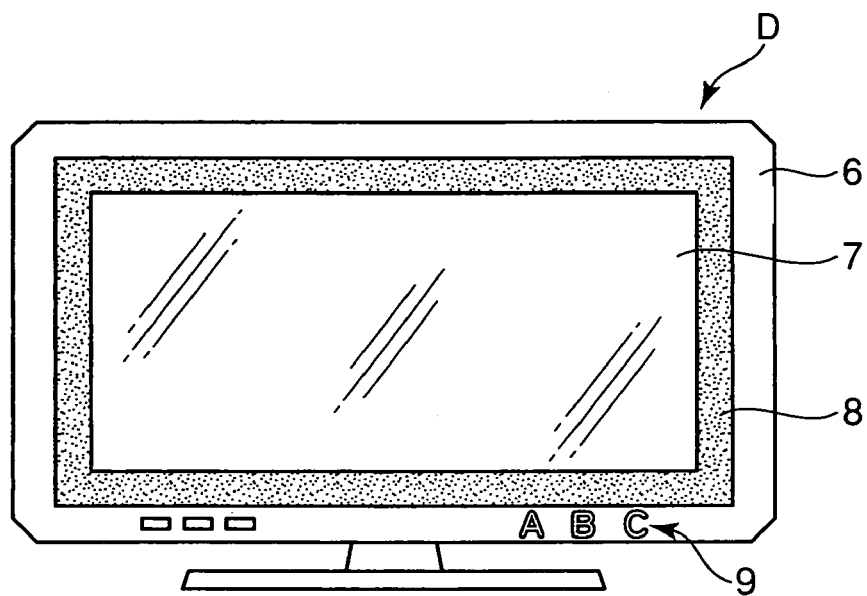
FIGS. 9(A) and 9(B) are front views showing a display using a conventional electromagnetic wave shielding material that is off and on, respectively.
Figure 9:
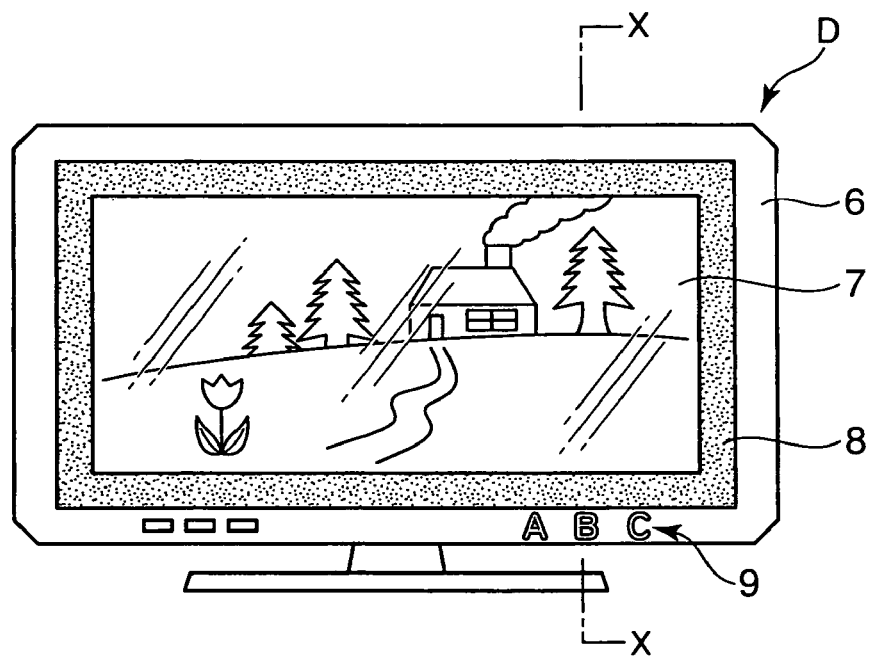
Figure 10:
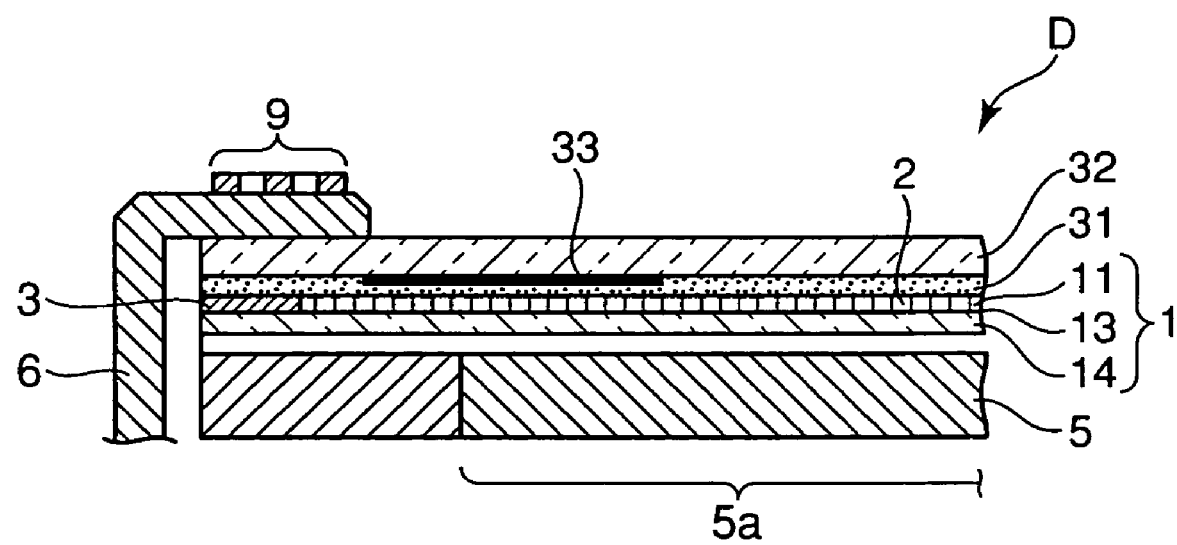
FIG. 10 is a sectional view showing section X-X in FIG. 9(B).

FIG. 1 is a plane view showing an electromagnetic wage shielding material according to the present invention; FIG. 2 is a sectional view showing an example of section X-X in FIG. 1; FIG. 3 is a sectional view showing another example of section X-X in FIG. 1; FIG. 4 is a sectional view showing another embodiment of the sectional structure shown in FIG. 3; FIG. 5(A) is a front view showing a display according to the present invention that is off, and FIG. 5(B), a front view showing this display that is on; and FIG. 6 is a sectional view showing an example of section X-X in FIG. 5(B). FIGS. 7 to 10 are for making a comparison with the present invention. FIG. 7 is a plane view showing a conventional electromagnetic wave shielding material; FIG. 8 is a sectional view showing section X-X in FIG. 7; FIG. 9(A) is a front view showing a display using a conventional electromagnetic wave shielding material, that is off, and FIG. 9(B), a front view showing this display that is on; and FIG. 10 is a sectional view showing section X-X in FIG. 9(B).

Like reference characters designate corresponding parts in FIGS. 1 and 3 and FIGS. 7 and 8, as well as in FIGS. 5 and 6 and FIGS. 9 and 10, and the description of the corresponding parts will not be repeated twice.

As shown in FIGS. 1 and 6, a display D comprises a display device 5 having an image-luminescent part 5a, an electromagnetic wave shielding material 1 placed on the observer H side of the display device 5, and a transparent substrate 32 placed on the observer H side of the electromagnetic wave shielding material 1 with a transparent adhesive layer 31 between the transparent substrate 32 and the electromagnetic wave shielding material 1. A frame 6 retains the electromagnetic wave shielding material 1 and the transparent substrate 32 to the display device 5.

Of these components of the display, the electromagnetic wave shielding material 1 comprises a light-shielding electrical conductor layer 11 having, on its observer H-side external surface, a blackening layer 12. This electrical conductor layer 11 comprises a mesh portion 2 having a large number of openings 2a, and a frame portion 3 surrounding the mesh portion 2. The image-luminescent part 5a includes a center portion 5b and an outer edge portion 5c around the center portion 5b. When the electromagnetic wave shielding material 1 is placed on the display device 5, the mesh portion 2 faces the center portion 5b of the image-luminescent part 5a, and the frame portion 3 faces the outer edge portion 5c of the image-luminescent part 5a.

The electromagnetic wave shielding material 1 of the present invention is in such a shape that its whole contour corresponds to the shape of the screen of the display, and this shape is usually such a rectangle as the one shown in FIG. 1, or a slight modification thereof. As mentioned above, the center portion of the electromagnetic wave shielding material 1 is the mesh portion 2 that has a large number of openings adjoining one another, passing the displayed image, and faces the center portion 5b of the image-luminescent part 5a of the display device. The area surrounding the mesh portion 2 is the frame portion 3 that faces the outer edge portion 5c of the image-luminescent part 5a of the display devices 5. In FIG. 1, the openings in the mesh portion 2 are dimensionally exaggerated for easy understanding of structure.

The frame portion 3 of the electromagnetic wave shielding material 1 includes a light-transmitting pattern part 4 perforated to have openings that make up the desired pattern whose plane figure shows a product designation or the like. This light-transmitting pattern part 4 is in such a position that it faces the outer edge portion 5c of the image-luminescent part 5a of the display device 5. While the display device 5 is emitting light, the light from the display device 5 passes through openings 4a in the light-transmitting pattern part 4, so that the light-transmitting pattern part 4 glows patternwise. In this manner, the pattern such as a product designation glows and is indicated in a predetermined position in the outer edge portion 5c around the screen. While the display device 5 is emitting no light, the light-transmitting pattern part 4 does not glow and is substantially unnoticeable, so that the pattern disappears.

FIGS. 2 and 3 show typical embodiments of the section of the electromagnetic wave shielding material 1 shown in FIG. 1. The electromagnetic wave shielding material 1 shown in FIG. 2 is composed of the electrical conductor layer 11 and the blackening layer 12 formed on the surface (on the observer side) of the electrical conductor layer 1-1. The perforated mesh portion 2 has openings 2a that transmit imaging light, and the perforated frame portion 3 includes, in a predetermined position, patterned openings 4a. On the other hand, the electromagnetic wave shielding material 1 shown in FIG. 3 comprises a transparent adhesive layer 13 and a transparent substrate 14 in addition to the above-described electrical conductor layer 11 and blackening layer 12. FIG. 3 shows an embodiment that the transparent substrate 14 will be faced to the display device. In an embodiment that the transparent substrate 14 is directed to the observer side, the blackening layer 12 is positioned-on the transparent substrate 14 side of the electrical conductor layer 11 (the lower side in the figure).

As for the sectional structure of the electromagnetic wave shielding material of the present invention, there are the following structures in addition to the above-described ones shown in the figures: a single-layer structure consisting of a black-colored electrical conductor layer; and a modification of the structure shown in FIG. 3, which the electrical conductor layer 11 and the blackening layer 12 are laminated directly to the transparent substrate 14 without the transparent resin layer 13. Another possible structure is one shown in FIG. 4, in which various functional layers are added to the structure shown in FIG. 3. In FIG. 4, reference numeral 21 designates an anticorrosive layer; reference numeral 22 designates a transparentizing resin layer; reference numeral 23 designates a layer serving both as an adhesive layer and a color-tone-controlling layer; reference numeral 24 designates a near-infrared-light-shielding layer; reference numeral 25 designates, an adhesive layer; and reference numeral 26 designates a layer serving both as an antireflection layer and an ultraviolet-light-absorbing layer.

As mentioned above, a display D of the present invention can be obtained by placing the electromagnetic wave shielding material 1 on the observer H side of a display device 5 (having the image-luminescent part) selected from various ones. Examples of the display device 5 useful herein include plasma display panels (PDPs), cathode ray tubes (CRTs), electroluminescent devices (EL elements), and liquid crystal display devices (LCDs). Examples of embodiments of the placement of the electromagnetic wave shielding material 1 on the observer side (image-luminescent face) of the display device include an embodiment that the electromagnetic wave shielding material 1 of the type shown in FIG. 2 or 3 is laminated directly to the surface of the display device with, if necessary, an adhesive layer, and an embodiment that a laminate of the electromagnetic wave shielding material 1 and a transparent substrate 32 that has been prepared beforehand is, as shown in FIG. 6, mounted on the front surface of the display device.

The display D shown in FIGS. 5(A) and 5(B) is that such an electromagnetic wave shielding material 1 as the one shown in FIG. 1 is mounted on the observer H-side surface of the display device 5 such as a plasma display panel, as shown in FIG. 6, a sectional view. The electromagnetic wave shielding material 1 is so placed that the inner edge portion of the frame portion 3 faces the outer edge portion 5c of the image-luminescent part 5a of the display device 5, and that the blackening layer faces to the observer side (although the blackening layer is omitted from the figure so as not to make the figure complicated, the electrical conductor layer 11 shown in FIG. 6 actually has, on its surface facing the transparent substrate 32, the blackening layer). In the embodiment shown in FIG. 6, the electromagnetic wave shielding material 1 that has been laminated to the transparent substrate 32 such as a glass plate with a transparent adhesive layer 31, with the blackening layer facing to the transparent substrate 32, faces the display device 5. The peripheral portion of the electromagnetic wave shielding material 1 laminated to the transparent substrate 32 and that of the display device 5 are covered with a frame 6, with at least a portion, including the light-transmitting pattern part 4, of the frame portion 3 of the electromagnetic wave shielding material 1 left exposed.

In the display D having the above-described structure, a trim 8, a black-colored light-shielding layer, is present around the effective display area 7 of the screen, as in the prior art shown in FIG. 9(A). The trim 8, the black-colored light-shielding layer, in the present invention differs from that in the conventional art in the following respect: in the conventional art, the black-colored light-shielding layer 33 is formed on the back surface of the transparent substrate 32, separately from the electromagnetic wave shielding material 1, by printing using black ink, as shown in FIG. 10; while in the present invention, the inner peripheral portion of the frame portion 3 of the electromagnetic wave shielding material 1, having the blackening layer 12, forms the trim 8, as shown in FIG. 6. As can be understood from FIG. 6, a sectional view, the effective display area 7 refers to the image-luminescent part 5a of the display 5 device, excluding its outer edge portion 5c that is shielded from light by the trim 8 (the frame portion 3), and is an area on which an image can be actually observed.

When the display D shown in FIG. 5(A) is switched on, the light-transmitting pattern part 4 of the trim 8, the black-colored light-shielding layer, glows due to the imaging light passing through the light-transmitting pattern part 4, and the desired pattern is thus indicated. When the power source is turned off, no light passes through the light-transmitting pattern part 4, so that the pattern part disappears as shown in FIG. 5(A). On the other hand, in the display D shown in FIGS. 9(A) and 9(B), the indication pattern 9 has been printed on the frame 6 with ink, so that it remains indicated whether the display D is on or off.

The electrical conductor layer 11, a constituent layer of the electromagnetic wave shielding material 1, has the function of shielding electromagnetic waves. Even though this layer itself is opaque, since it has a large number of openings 2a adjoining one another, it has both electromagnetic-wave-shielding properties and light-transmitting properties. Examples of the plane figure of each opening include triangles such as equilateral triangles, squares such as regular squares, rectangles, rhombuses and trapezoids, polygons such as hexagons, as well as circles and ovals. Although the openings 2a are not limited in shape, the plane figure of each opening is typically a regular square. The mesh portion 2 has a large number of the openings 2a in the above-described shape, made adjacently to one another. In general, the openings are in the same shape and size over the entire mesh portion 2, and line parts with a uniform width define these openings. Specifically, the width of the line parts that define the openings is made 25 μm or less, preferably 20 μm or less, with consideration for opening rate and mesh visibility. The size of the opening is defined as [line distance or line pitch]-[line width], and it is preferable to make [line distance or line pitch] 150 μm or more, preferably 200 μm or more, from the viewpoint of light transmittance. The bias angle (the angle between the line parts of the mesh and the sides of the electromagnetic wave shielding material) is properly determined with consideration for the pixel pitch and emission properties of the display device so that moire fringes do not easily occur (in FIG. 1, the bias angle relative to the lower side of the electromagnetic wave shielding material is 45°).

Any material having electrical conductivity good enough to shield electromagnetic waves can be used to form the electrical conductor layer 11, and metal foil is, in general, preferred because of its good electrical conductivity. The electrical conductor layer 11 in the form of a laminate with the transparent substrate 14 can be obtained by vacuum-depositing or coating the transparent substrate 14 with a metal layer, or by laminating metal foil to the transparent substrate 14. Examples of materials for the metal foil or layer include metals such as gold, silver, copper, iron, nickel, chromium, and aluminum. The metals may be alloys, and the metal foil or layer may be single- or multi-layer one. Low-carbon steels such as low-carbon rimmed steels and low-carbon aluminum killed steels, Ni—Fe alloys, and invar alloys are herein preferred as iron materials. When the metal is copper, copper and copper alloys are useful. Although copper foil includes rolled copper foil and electrolytic copper foil, the latter is preferred because of its thinness, uniformity in thickness, adhesion to the blackening layer, and so forth.

The thickness of the electrical conductor layer 11 made of metal foil or a metal layer is about 1 to 100 μm, and preferably 5 to 20 μm. If the electrical conductor layer 11 is made thinner than 1 μm, the electrical resistance value is increased, so that it becomes difficult to obtain good electromagnetic-wave-shielding properties. When the electrical conductor layer 11 is made thicker than 100 μm, it becomes difficult to make the layer into the desired fine mesh. Consequently, the mesh has a decreased opening rate and impaired light-transmitting properties, and the side faces of the openings of the mesh make the viewing angle narrower.

Further, it is preferred that the surface of the metal foil or layer for the electrical conductor layer 11 be rough, when improvement in adhesion to the adjoining layers such as the transparent adhesive layer is taken into consideration. For example, when copper foil is subjected to blackening treatment, a blackening layer is deposited on the copper foil, and, at the same time, the surface of the copper foil (the surface of the blackening layer) is roughened. The roughness of such a roughened surface is preferably about 0.1 to 10 μm, more preferably 1.5 μm or less, most preferably 0.5 to 1.5 μm, as indicated by the Rz value, the mean value of 10 measurements obtained in accordance with JIS-B0601 (1994 version). When the surface roughness of the metal foil is less than 0.1 μm, the effect of surface roughening cannot be fully obtained. When the surface roughness is in excess of 10 μm, an adhesive or resist, upon application thereof, tends to involve air to produce air bubbles.

The efficiency in shielding electromagnetic waves of the electrical conductor layer 11 is determined according to the purpose and intended use of the electromagnetic wave shielding material. The efficiency in shielding electromagnetic waves is determined by the material for and the thickness of the electrical conductor layer 11, and the diameter of the openings and the width of the line parts (opening rate). The electromagnetic wave shielding material is, therefore, designed by controlling these factors so that the required efficiency in shielding electromagnetic waves can be obtained. In general, the efficiency in shielding electromagnetic waves required for an electromagnetic wave shielding material for a plasma display panel is such that electromagnetic waves in a frequency band of 30 MHz to 1 GHz are attenuated by 30 dB or more.

The blackening layer 12 that is formed on the external surface of the electrical conductor layer 11 is originally for increasing image contrast in a bright room, and a conventional blackening layer selected properly can be herein used so long as it assumes a dark color such as black and meets the basic properties such as adhesion properties. Specific examples of materials useful for the blackening layer 12 include inorganic materials such as metals, and organic materials such as black-colored resins. For example, when an inorganic material is used, a metallic layer, such as a layer of a metal, an alloy, or a metallic compound such as a metallic oxide or sulfide, is formed as the blackening layer 12. To form such a metallic layer, a method selected from various conventional methods of blackening treatment can be employed. Of the conventional methods, blackening treatment by plating is preferred from the viewpoint of adhesion properties, uniformity, and easiness of formation of the blackening layer. For example, a metal such as copper, cobalt, nickel, zinc, molybdenum, tin, or chromium, a metallic compound of such a metal, or the like is used as the material for the blackening layer.

In the case where the electrical conductor layer 11 is made of copper foil, a plating process favorable for the blackening treatment for forming the blackening layer 12 is cathodic electrodeposition plating in which the copper-made electrical conductor layer is subjected to cathodic electrolysis in an electrolyte such as sulfuric acid, copper sulfate, or cobalt sulfate, thereby depositing cationic particles on the electrical conductor layer. The cationic particles deposited make the electrical conductor layer black in color and, at the same time, roughen the surface of the electrical conductor layer. The cationic particles may be either copper particles or particles of an alloy of copper and another metal. Copper-cobalt alloy particles are herein preferred as the copper alloy particles, and the mean particle diameter of the copper alloy particles is preferably 0.1 to 1 μm. By depositing copper-cobalt alloy particles, there can be obtained a blackening layer made of a copper-cobalt alloy particle layer. Cathodic electrolysis is advantageous also in that uniformly sized cationic particles with a mean particle diameter of 0.1 to 1 μm can be deposited. When cationic particles with a mean particle diameter of more than 1 μm are deposited, the deposited particles are poor in denseness and are insufficient and non-uniform in blackness, and the falling of the particles (powder falling) tends to occur. Also in the case where cationic particles with a mean particle diameter of less than 0.1 μm are deposited, the deposited particles have decreased blackness. If cathodic electrolysis is conducted at a high current density, the treated surface becomes cathodic and is activated by generation of reducing hydrogen, which leads to significant enhancement of adhesion between the copper surface and the cationic particles.

For the blackening layer 12, black chromium, black nickel, nickel alloys, and so forth are also favorable. Examples of nickel alloys useful herein include nickel-zinc alloys, nickel-tin alloys, and nickel-tin-copper alloys. Particularly, nickel alloys are excellent in blackness and electrical conductivity and can make the blackening layer 12 corrosion resistant. Moreover, since the particles forming the blackening layer 12 are generally in the form of needles, they are readily deformed by external force to undergo change in appearance. However, nickel alloy particles are not easily deformed, so that a blackening layer 12 of nickel alloy particles scarcely undergo change in appearance in the subsequent processing steps. A conventional electrolytic or electroless plating process may be employed to deposit nickel alloy particles to form a blackening layer. A nickel alloy may be deposited after conducting nickel plating.

To make the mesh portion 2 of the electromagnetic wave shielding material 1, the metal foil or layer for the electrical conductor layer 11 is photo-etched to make therein openings in the desired shape. Namely, the electromagnetic wave shielding material 1 shown in FIG. 2 is obtained by etching metal foil to make therein openings.

The electromagnetic wave shielding material 1 shown in FIG. 3 can be obtained by laminating metal foil in which openings have been made beforehand, to a transparent substrate 14 with a transparent adhesive layer 13, or by etching pattern-wise, to make openings, a metal layer that has been laminated beforehand to a transparent substrate 14 with a transparent adhesive layer 13.

The light-transmitting pattern part 4 is a perforated part having openings 4a in the desired pattern, situated in a predetermined position in a portion of the frame portion 3 that will face the outer edge portion 5c of the image-luminescent part 5a of the display device 5. A method for perforating the frame portion 3 of the electromagnetic wave shielding material 1 to make openings in the desired pattern is as follows: a predetermined pattern (in the form of a negative or positive) is formed beforehand in a predetermined position in a mask for use in exposure of a photosensitive resin to light for forming the pattern of the mesh portion 2, and at the same time as the perforation of the electrical conductor layer 11 that is conducted by photo-etching to form the pattern of the mesh portion 2, the frame portion 3 is perforated to form the pattern of the light-transmitting pattern part 4. Another possible method is that the frame portion 3 is perforated by press cutting to make openings in the pattern of the light-transmitting pattern part 4. The desired pattern of the light-transmitting pattern part 4 includes a product designation, a manufacturer's designation, and artistic designs. These patterns are made up of letters, numbers, symbols, geometrical figures, and so forth.

The transparent substrate 14 is a layer for reinforcing the electrical conductor layer 11 and is used when the electrical conductor layer 11 is poor in mechanical strength. When the electrical conductor layer itself has good strength and shape retention, and if additional properties other than electromagnetic-wave-shielding properties are not required for the electromagnetic wave shielding material, the electrical conductor layer 11 having the mesh portion 2 and the frame portion 3 is singly used to make the electromagnetic wave shielding material 1. Any material fitted for the intended use of the electromagnetic wave shielding material, selected with consideration for heat resistance, insulating properties, and so forth, can be used for the transparent substrate 14 so long as it has mechanical strength and light-transmitting properties. Specific examples of materials useful for the transparent substrate 14 include resin plates, resin sheets (including films, the same shall apply hereinafter), and glass plates.

Examples of transparent resins to be made into resin plates, resin sheets, or the like include polyester resins such as polyethylene terephthalate, polybutylene terephthalate, polyethylene naphthalate, terephthalic acid-isophthalic acid-ethylene glycol copolymers, and terephthalic acid-cyclohexane dimethanol-ethylene glycol copolymers; polyamide resins such as nylon 6; polyolefin resins such as polypropylene and polymethyl pentene; acrylic resins such as polymethyl methacrylate; styrene resins such as polystyrene and styrene-acrylonitrile copolymers; cellulose resins such as triacetyl cellulose; imide resins; and polycarbonate resins. Viewing from material, one of the above-enumerated resins, or a resin mixture (including a polymer alloy) of two or more of the resins is used for the transparent substrate. Viewing from lamination, either a single resin layer or a laminate of two or more resin layers is used for the transparent substrate. In the case of a resin sheet, a monoaxially or biaxially oriented sheet is more favorable from the viewpoint of mechanical strength. Additives such as ultraviolet light absorbers, fillers, plasticizers, and antistatic agents may be added to these resins, as needed.

Glass useful for glass plates includes silica glass, borosilicate glass, and soda-lime glass, and more desirable glass includes non-alkali glass, which contains no alkali components and has a low rate of thermal expansion, good dimensional stability, and excellent working properties in high-temperature heat treatment. A glass plate can be made to serve also as an electrode substrate for use as the front substrate or the like of a display device.

There are no particular limitations on the thickness of the transparent substrate 14, and the thickness is determined according to the intended application of the electromagnetic wave shielding material. When a transparent resin is used for the transparent substrate 14, the thickness of the transparent substrate 14 is usually about 12 to 1000 μm, preferably between 50 μm and 700 μm, more preferably between 100 μm and 500 μm. Whichever material is used for the transparent substrate 14, a transparent substrate with a thickness of less than 12 μm cannot have sufficiently high mechanical strength, so that it curls, becomes wavy, or is broken; while a transparent substrate with a thickness of more than 1000 μm has excess performance, raises cost, and makes it difficult to produce a thinner flat-panel display.

Sheets (or films), plates, and so forth of these inorganic or organic materials are useful for the transparent substrate 14, and the transparent substrate 14 may be made to serve also as a front substrate that is a component part of a display body consisting of a front substrate, a rear substrate, and others. In an embodiment that the electromagnetic wave shielding material is used as a front filter that is placed on the front of a front substrate, a transparent substrate in the form of a sheet is superior, in thinness and lightness in weight, to a transparent substrate in the form of a plate. Further, it is needless to say that a transparent substrate made of a resin sheet is superior, in unbreakableness, to a transparent substrate made of a glass plate.

From the above-described point of view, resin sheets are the favorable materials for the transparent substrate 14. Of the resin sheets, sheets of polyester resins such as polyethylene terephthalate and polyethylene naphthalate, and cellulose resin sheets are preferred from the viewpoint of transparency, heat resistance, and cost, and polyethylene terephthalate sheets are most preferred. A transparent substrate having higher transparency is more favorable, and the preferred transparency, as indicated by the transmittance for visible light, is 80% or more.

The surface of the transparent substrate made of a resin sheet or the like may be optionally subjected to conventional adhesion-improving treatment such as corona discharge treatment, plasma treatment, ozone treatment, flame treatment, primer treatment, preheating treatment, dust-removing treatment, vacuum deposition, or alkali treatment.

The transparent adhesive layer 13 is for sticking and fixing the electrical conductor layer 11 to the transparent substrate 14. It is necessary to use a transparent adhesive for the transparent adhesive layer 13 so that the adhesive seen through the openings in the electrical conductor layer 11 does not disturb the transmission of light. Particularly when metal foil or a metal layer that has been laminated beforehand to the transparent substrate is etched to make openings, the adhesive is exposed over the whole mesh portion, so that transparency is required for the adhesive. Although any conventional method can be employed to laminate the metal foil and the transparent substrate, dry laminating is commonly used when a resin sheet, a typical material for the transparent substrate, is used.

Any conventional adhesive selected properly may be used as the transparent adhesive for the transparent adhesive layer 13. Examples of adhesives useful herein include urethane adhesives, acrylic adhesives, epoxy adhesives, and rubber adhesives. Of these adhesives, urethane adhesives are preferred from the viewpoint of adhesive force and so forth. Urethane adhesives include two-pack curable urethane resin adhesives, which use two-pack curable urethane resins comprising various hydroxyl-group-containing compounds such as polyether polyol, polyester polyol, and acryl polyol, and various polyisocyanate compounds such as tolylene diisocyanate and hexamethylene diisocyanate.

The transparent adhesive layer 13 is formed by applying a transparent adhesive to one of or both of the metal foil (preferably one in which openings have not yet been made) and the transparent substrate by a conventional method of application, and laminating the metal foil and the transparent substrate to each other. Examples of the method of application include coating methods such as roll coating, comma coating, and gravure coating, and printing methods such as screen printing and gravure printing. Although the transparent adhesive layer may be formed in any thickness (dry basis), the thickness is usually 0.1 to 20 μm, and a thickness of 1 to 10 μm is more preferred from the viewpoint of adhesive force, cost, and handling.

When various properties other than electromagnetic-wave-shielding properties are required for the electromagnetic wave shielding material 1, various functional layers are, as shown in FIG. 4, laminated to the electromagnetic wave shielding material 1, or the electromagnetic wave shielding material 1 is subjected to treatment so that it acquires various properties. Examples of functional layers are as follows.

[Anticorrosive Layer]

The electromagnetic wave shielding material 1 may be composed only of the electrical conductor layer 11 and the blackening layer 12. However, since the electrical conductor layer made from a metal can rust away and deteriorate in the course of production or during handling to have impaired electromagnetic-wave-shielding properties, the surface of the electrical conductor layer 11 may be coated with an anticorrosive layer 21 if it is necessary to prevent corrosion of the electrical conductor layer 11. Further, when the blackening layer 12 readily rusts away, it is desirable to coat both the electrical conductor layer 11 and the blackening layer 12 with an anticorrosive layer 21. To coat one or more faces selected from the front surface, the back surface, and the side faces of the electrical conductor layer is satisfactory for protection against corrosion. Any material can be used for the anticorrosive layer 21 as long as it rusts less easily than the electrical conductor layer 11 does, and inorganic materials such as metals, organic materials such as resins, combinations of these materials, and so forth are herein useful. By coating, with the anticorrosive layer 21, the blackening layer 12 as well, it is, in some cases, possible to prevent falling or deformation of the particles that form the blackening layer 12, and also increase the blackness of the blackening layer. When metal foil is used for the electrical conductor layer 11, and if the blackening layer is formed beforehand on the metal foil on the transparent substrate by blackening treatment, it is preferable to form the anticorrosive layer on the blackening layer before laminating the transparent substrate and the metal foil, when prevention of falling or deterioration of the blackening layer is taken into consideration.

A conventional anticorrosive layer selected properly can be used for the anticorrosive layer 21, and examples of anticorrosive layers useful herein include layers of metals such as chromium, zinc, nickel, tin and copper, alloys, metallic oxides, and metallic compounds. A conventional plating process or the like can be used to form these layers. An example of the anticorrosive layer favorable from the viewpoint of anticorrosive properties, adhesive properties, and so forth is a chromium compound layer obtained by subjecting the electrical conductor layer to chromate treatment after plating it with zinc. This anticorrosive layer of a chromium compound is also excellent in adhesion to the blackening layer made of a copper-cobalt alloy particle layer and to the transparent adhesive layer (especially, a two-pack curable urethane resin adhesive layer).

When chromium is used for the anticorrosive layer, chromate (chromic acid salt) treatment or the like may be carried out. To carry out the chromate treatment, a chromate treatment liquid is brought into contact with a surface to be treated. This contact can be made by such a coating method as roll coating, curtain coating, squeeze coating, or cast coating (for bringing a chromate treatment liquid into contact with one surface). Electrostatic spray coating, dip coating, or the like makes it possible to bring a chromate treatment liquid into contact with both surfaces. After bringing the chromate treatment liquid into contact with the surface to be treated, the surface is dried without washing it with water. An aqueous solution containing chromic acid is usually used as the chromate treatment liquid. Specific examples of chromate treatment liquids useful herein include treatment liquids such as "Alsurf (trademark) 1000" (manufactured by Nippon Paint Co., Ltd., Japan), and "PM-284" (manufactured by Nippon Parkerizing Co., Ltd., Japan). In view of adhesion and anticorrosion, it is preferable to plate the surface with zinc before subjecting it to the chromate treatment. Further, a silicon compound such as a silane coupling agent may be incorporated in the anticorrosive layer so that the anticorrosive layer shows improved resistance to acids in the step of etching or washing with an acid. The thickness of the anticorrosive layer is usually about 0.001 to 10 µm, preferably 0.01 to 1 µm.

[Transparentizing Resin Layer]

When another layer (e.g., a near-infrared-light-shielding layer in FIG. 4) is further laminated to the electrical conductor layer 11 with an adhesive layer, since air in the openings is not easily replaced with the adhesive, the air can remain in the openings as air bubbles and diffuse imaging light, whereby a blurred image is produced and image visibility is lowered. Or in the case where the electrical conductor layer 11 that has been laminated beforehand to the transparent substrate 14 with the transparent adhesive layer 13 is etched to make openings, since the transparent-adhesive-layer-side surface of the electrical conductor layer 11 is rough, which is effective in improving adhesion by anchor effect, the transparent adhesive layer 13 exposed at the openings has a rough surface as a reflection of the surface roughness of the electrical conductor layer 11. The rough surface of the transparent adhesive layer 13 diffuses the imaging light, and the diffused light can produce a blurred image, or lower image visibility.

To smooth, as shown in FIG. 4, the surface of the electrical conductor layer 11 by filling and covering the openings (concavities) in the electrical conductor layer 11 with a transparent resin is an effective measure to solve the above-described problem. A layer of this transparent resin is herein referred to as a transparentizing resin layer 22. Examples of transparentizing resins useful for this purpose include resins whose refractive indices are close to that of the transparent adhesive layer 13 with which the transparentizing resin layer 22 comes into contact, specifically, resins whose refractive indices differ from that of the transparent adhesive layer 13 by 0.14 or less. If such a measure is taken, the roughness of the interface between the transparent adhesive layer and the transparentizing resin layer is optically eliminated, and the two layers optically merge together. For example, when a urethane resin is used for the transparent adhesive layer, a urethane resin, an acrylic resin, or the like is used as the transparentizing resin.

[Near-Infrared-Light-Shielding Layer]

When a display device emits near infrared light, remotely controlled apparatus can malfunction because the wave range of this near infrared light overlaps that of infrared light with which the remotely controlled apparatus operate. In order to prevent such malfunction, it is preferable to laminate a near-infrared-light-shielding layer 24. For the near-infrared-light-shielding layer 24 is used a mixture prepared by adding, to a resin such as polyester, urethane, or acrylic resin, a compound having absorption in the near infrared region, such as a diimmonium, cyanine, or phthalocyanine compound. This mixture is applied, or a film of the mixture that has been formed beforehand is laminated with an adhesive, to form the near-infrared-light-shielding layer 24.

[Color-Tone-Controlling Layer]

There is a case where the visible light emitted from a display contains unwanted light that disturbs good natural-color reproduction. For example, in the case of a plasma display panel, such unwanted light is one with a wavelength of 570 to 605 nm, originated from neon atom. In this case, it is preferable to form a color-tone-controlling layer 23 by applying a resin containing a dye capable of absorbing the unwanted light, or by laminating, with an adhesive, a film of the resin that has been formed beforehand.

Although the color-tone-controlling layer, of course, may be formed as an independent layer, the above-described dye may be added to another layer so that this layer can serve also as the color-tone-controlling layer. In the embodiment shown in FIG. 4, the layer 23 serves both as the adhesive layer and the color-tone-controlling layer.

[Ultraviolet-Light-Absorbing Layer]

It is preferable to form an ultraviolet-light-absorbing layer 26 when it is necessary to prevent deterioration (change in color, fading, decrease in strength, etc.) of the constituent layers of the electromagnetic wave shielding material or of the components of the display that is caused by ultraviolet light contained in sunlight and so forth entering the display from the outside. For the ultraviolet-light-absorbing layer 26 is used a resin, such as polyester, urethane, or acrylic resin, to which an ultraviolet light absorber such as a benzotriazole or benzophenone compound has been added. Such a resin is applied, or a film of the resin that has been formed beforehand is laminated with an adhesive, to form the ultraviolet-light-absorbing layer.

Although the ultraviolet-light-absorbing layer, of course, may be formed as an independent layer, the ultraviolet light absorber may be added to another layer so that this layer can serve also as the ultraviolet-light-absorbing layer. In the embodiment shown in FIG. 4, the layer 26 serves both as an antireflection layer and the ultraviolet-light-absorbing layer.

(Antireflection or Anti-Glaring Layer)

When ambient light, such as sunlight and lamplight, is incident on a display, its screen reflects this light, and the reflected light whitens the displayed image or decreases contrast. To avoid such a trouble, it is preferable to form an antireflection or anti-glaring layer 26 on the outermost surface of the electromagnetic wave shielding material.

The antireflection layer 26 is typically a multi-layered one composed, for example, of high-refractive-index layers and low-refractive-index layers that are laminated alternately so that a low-refractive index layer forms the outermost layer. A dry process such as vacuum deposition or sputtering, or even a wet process such as coating, can be employed to form such a multi-layered antireflection layer. Examples of the material for the low-refractive-index layer include oxides of silicon, magnesium fluoride, and fluoroplastics. Examples of the material for the high-refractive-index layer include titanium oxide, zinc sulfide, zirconium oxide, and niobium oxide.

A layer with a surface having fine irregularities that scatter extraneous light may be formed as the anti-glaring layer 26 by applying a resin binder containing an inorganic filler such as silica, or by shaping a layer with a shaping sheet or plate. A curable acrylic resin, an ionizing-radiation curing resin, or the like is favorably used as the resin binder because surface strength is required for the anti-glaring layer that forms a surface layer.

The previously illustrated electromagnetic wave shielding material 1 having the sectional structure shown in FIG. 4 is an electromagnetic wave shielding material that is provided with the function of a composite filter by successively laminating, to the surface of the electromagnetic wave shielding material having the sectional structure shown in FIG. 3, the anticorrosive layer 21, the transparentizing resin layer 22, the layer 23 serving both as the adhesive layer and the color-tone-controlling layer, formed by the use of an adhesive containing a color-tone-controlling agent, the near-infrared-light-shielding layer 24, and, with the adhesive layer 25, the layer 26 serving both as the antireflection layer and the ultraviolet-light-absorbing layer, that is a low-refractive-index layer formed on a transparent film containing an ultraviolet light absorber.

The invention claimed is:

1. An electromagnetic wave shielding material incorporated in a display having an image-luminescent part including a center portion and an outer edge portion, the electromagnetic wave shielding material being placed on an observer side of the image-luminescent part, comprising:
   a light-shielding electrical conductor layer having, on its observer-side external surface, a blackening layer,
   the electrical conductor layer comprising a mesh portion that has a large number of openings and faces the center portion of the image-luminescent part, and a frame portion that surrounds the mesh portion and faces the outer edge portion of the image-luminescent part,
   the center portion of the image-luminescent part being an effective display area, on which an image can be observed, and the outer edge portion of the image-luminescent part excluding the effective display area,
   wherein the frame portion includes a light-transmitting pattern part having patterned openings, and
   wherein the frame portion covers the outer edge portion of the image-luminescent part and extends further outward, and the light-transmitting pattern part is made so that it is on the outer edge portion of the image-luminescent part.

2. The electromagnetic wave shielding material according to claim 1, further comprising
   a transparent substrate for supporting the electrical conductor layer, laminated to the image-luminescent-part-side surface of the electrical conductor layer.

3. The electromagnetic wave shielding material according to claim 2, wherein
   the electrical conductor layer is laminated to the transparent substrate with a transparent adhesive layer.

4. The electromagnetic wave shielding material according to claim 1, further comprising
   an anticorrosive layer formed on the blackening layer on the electrical conductor layer.

5. The electromagnetic wave shielding material according to claim 1, further comprising
   a transparentizing resin layer formed to cover the mesh portion of the electrical conductor layer.

6. The electromagnetic wave shielding material according to claim 5, wherein
   at least one selected from a color-tone-controlling layer, a near-infrared-light-shielding layer, an antireflection layer, and an ultraviolet-light-absorbing layer, is formed on the transparentizing resin layer.

7. A display comprising:
   an image-luminescent part including a center portion and an outer edge portion, and
   an electromagnetic wave shielding material placed on an observer side of the image-luminescent part,
   the electromagnetic wave shielding material comprising a light-shielding electrical conductor layer having, on its observer-side external surface, a blackening layer,
   the electrical conductor layer comprising a mesh portion that has a large number of openings and faces the center portion of the image-luminescent part, and a frame portion that surrounds the mesh portion and faces the outer edge portion of the image-luminescent part,
   the center portion of the image-luminescent part being an effective display area, on which an image can be observed, and the outer edge portion of the image-luminescent part excluding the effective display area,
   wherein the frame portion includes a light-transmitting pattern part having patterend openings, and
   wherein the frame portion covers the outer edge portion of the image-luminescent part and extends further outward, and the light-transmitting pattern part is made so that it is on the outer edge portion of the image-luminescent part.

8. The display according to claim 7, further comprising
   a transparent substrate for supporting the electrical conductor layer, laminated to the image-luminescent-part-side surface of the electrical conductor layer.

9. The display according to claim 8, wherein
   the electrical conductor layer is laminated to the transparent substrate with a transparent adhesive layer.

10. The display according to claim 7, further comprising
    an anticorrosive layer formed on the blackening layer on the electrical conductor layer.

11. The display according to claim 7, further comprising
    a transparentizing resin layer formed to cover the mesh portion of the electrical conductor layer.

12. The display according to claim 11, wherein
    at least one selected from a color-tone-controlling layer, a near-infrared-light-shielding layer, an antireflection layer, and an ultraviolet-light-absorbing layer, is formed on the transparentizing resin layer.

\* \* \* \* \*